United States Patent [19]

Starr

[11] Patent Number: 4,468,612

[45] Date of Patent: Aug. 28, 1984

[54] ARRANGEMENT FOR INDICATING WHEN DIFFERENT TYPES OF ELECTRICAL COMPONENTS ARE INTERCONNECTED

[75] Inventor: Thomas J. J. Starr, Wheaton, Ill.

[73] Assignee: AT&T Bell Laboratories, Murray Hill, N.J.

[21] Appl. No.: 339,380

[22] Filed: Jan. 15, 1982

[51] Int. Cl.³ .................... G01R 19/00; G01R 31/02
[52] U.S. Cl. ................................ 324/66; 324/73 PC; 339/113 B
[58] Field of Search ................ 324/66, 73 R, 73 PC, 324/51, 158 F; 179/175.3 A; 339/113 R, 113 B; 340/568, 572

[56] References Cited

U.S. PATENT DOCUMENTS

| | | | |
|---|---|---|---|
| 3,235,797 | 2/1966 | Boscia et al. | 339/113 B X |
| 3,728,616 | 4/1973 | Cheek et al. | 324/66 X |
| 3,818,329 | 6/1974 | Reaves | 324/66 X |
| 4,074,187 | 2/1978 | Miller et al. | 324/66 X |
| 4,228,328 | 10/1980 | Gawron, Jr. et al. | 179/175.2 R |
| 4,236,246 | 11/1980 | Skilling | 371/27 |

FOREIGN PATENT DOCUMENTS 95879  7/1980  Japan ........................... 324/66

Primary Examiner—Gerard R. Strecker
Attorney, Agent, or Firm—R. J. Godlewski; P. Visserman

[57] ABSTRACT

An arrangement for indicating when different types of electrical components, such as circuit boards and the like, are concurrently joined with connector assemblies. Common to the connector assemblies is a plurality of output conductors which is connected to corresponding plurality of output terminals positioned on each of the connector assemblies, respectively. On each component is a plurality of identification conductors arranged to identify the component through the application of a distinct pattern of potentials on the output conductors when one of the components is joined with one of the connector assemblies. When different types of components are concurrently joined with associated connectors, the identification conductors interconnect all the output conductors, such that only a predetermined pattern of potentials other than the distinct patterns may be applied to the output conductors.

11 Claims, 1 Drawing Figure

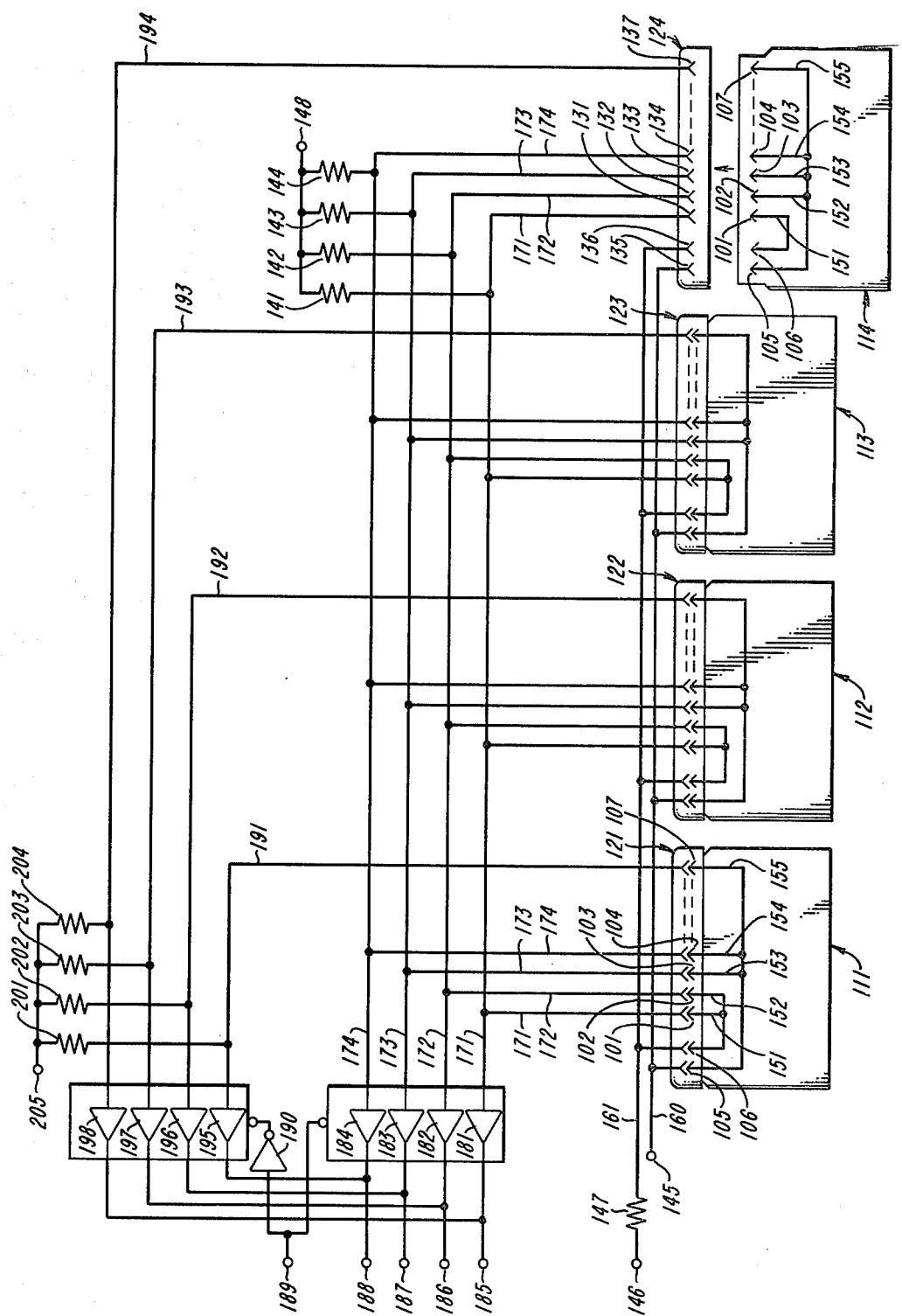

ARRANGEMENT FOR INDICATING WHEN DIFFERENT TYPES OF ELECTRICAL COMPONENTS ARE INTERCONNECTED

TECHNICAL FIELD

This invention relates to apparatus for electrically interconnecting electrical components and, more particularly, to an arrangement for indicating when different types of electrical components are interconnected.

BACKGROUND OF THE INVENTION

Electronic systems may comprise many electrically interconnected components, including circuit boards and associated connector assemblies. Typically, each board carries a portion of an electronic circuit and has a plurality of electrical terminals for connecting to the electrical terminals of other boards through the connector assemblies when the boards are inserted therein. Generally, each board is designed for insertion in only one uniquely associated connector assembly to prevent damage to the system as well as the board by means of mechanical or electrical keying arrangements.

Generally, mechanical keying arrangements prevent the complete insertion of an improper board into a connector assembly, whereas, electrical keying arrangements prevent the application of electrical signals to an improper board completely inserted in a connector assembly. However, there are systems in which the same set of connector assemblies must receive many groups of like type circuit boards, each group having a type of board which may be different from those in another group. One example would be a system for testing or modifying like types of circuit boards having erasable, programmable, ready-only memory units positioned thereon. Conventional keying arrangements would preclude such a system; however, it would still be highly desirable to prevent damage to the system as well as the boards when different types of circuit boards are concurrently inserted in an associated set of connector assemblies.

SUMMARY OF THE INVENTION

The foregoing problem is solved by an arrangement for indicating when different types of electrical components are concurrently joined with connector assemblies. Common to the connector assemblies is a plurality of output conductors which is connected to a corresponding plurality of output terminals positioned on each one of the connector assemblies, respectively. On each electrical component is a plurality of identification conductors which are adapted for identifying the type of component through the application of a distinct pattern of potentials on the output conductors when one of the components is joined with one of the connector assemblies. Effective when different types of components are concurrently joined with associated connector assemblies are means for applying to the output conductors a predetermined pattern of potentials other than the distinct patterns.

In one illustrative embodiment of the invention, the arrangement is utilized to indicate when different types of circuit boards are inserted into associated connectors. Positioned on each board is a plurality of identification terminals which connect to a corresponding plurality of output terminals on an associated connector, respectively, when the board is inserted therein. Common to the connector assemblies is a plurality of output conductors which corresponds and is connected to each plurality of output terminals, respectively. On each board is a plurality of identification conductors for connecting at least one identification terminal on the board to a first potential and for connecting the remaining identification terminals on the board to a second potential. These two potentials then form a distinct pattern of potentials on the output conductors to identify the type of board when one board is inserted in a connector. When different types of boards are inserted, the identification conductors on the inserted boards interconnect all the output conductors such that only one potential may be applied to the output conductors. In addition, when two or more like type of boards are inserted in associated connectors, the same distinct pattern of potentials which identified one inserted board, will appear on the output conductors.

BRIEF DESCRIPTION OF THE DRAWING

The invention may be better understood from the following detailed description when read with reference to the drawing which shows a plurality of circuit boards and connectors of an illustrative arrangement in accordance with this invention for indicating when different types of boards are concurrently inserted in associated connector assemblies.

DETAILED DESCRIPTION

Shown in the drawing is an illustrative arrangement for indicating when different types of electrical components, such as plug-in circuit board 114 and any one of like boards 111 through 113, are concurrently joined with associated connector assemblies, socket-type connectors 121 through 124. Common to the connectors is a plurality of output conductors 171 through 174 which is connected to a corresponding plurality of output terminals 131 through 134 positioned on each one of the connectors, respectively. On each circuit board is a plurality of identification conductor 151 through 154, which is connected respectively to a corresponding plurality of identification terminals 101 through 104, positioned thereon, for applying one of two different potentials to each identification terminal. The identification terminals are positioned on each board to connect to the corresponding plurality of output terminals on an associated connector, respectively, when the board is inserted therein. In addition, each identification conductor on a board is connected to one of two board input terminals 105 and 106 to which one of the two different potentials may be applied. Thus, the identification conductors are adapted or, more particularly, connected for identifying the type of board through the application of a distinct pattern of potentials on the output conductors when one board is inserted in an associated connector. Effective when different types of boards are currently inserted in associated connectors are means for applying to the output conductors a first predetermined pattern of potentials other than the distinct patterns. When two different types of boards are inserted, the identification conductors interconnect all the output conductors, thereby permitting only one of the two potentials to appear on each of the output conductors.

The identification conductors interconnect the input and identification terminals, which are part of an array positioned near one edge of each plug-in board, in such a manner as to form a unique identification code for identifying the board. The number of unique identification codes that may be formed is limited only by the number of identification terminals on each board and the manner in which they are connected to the board input terminals. As depicted, circuit boards 111 through 113 have the same identification code which is formed on each board by identification conductors 151 and 152 interconnecting identification and input terminals 101, 102, and 106, and by identification conductors 153 and 154 interconnecting identification and input terminals 103 through 105. Whereas, a different identification code is formed on board 114 by identification conductor 151 interconnecting only identification and input terminals 101 and 106 and by identification conductors 152 through 154 interconnecting all of identification and input terminals 102 through 105. Also included in the array on each board is board output terminal 107 which is used to complete a conducting path associated with each connector when a board is inserted therein. The board output terminal may be connected to one of the board input terminals for developing a potential thereon and, as depicted, is connected to board input terminal 105 via conductor 155.

On each connector is a similar array of electrical terminals which connect to the respective terminals of the array positioned on a circuit board when the board is inserted in the connector. Such an arrangement of electrical terminals may be found on any number of well-known and commerically available socket-type connectors for receiving the edge of a plug-in circuit board having correspondingly positioned terminals. Included in the array of electrical terminals on each connector are connector input terminals 135 and 136 which are positioned to connect to board input terminals 105 and 106, respectively, when the board is inserted therein. Conductors 160 and 161 interconnect connector input terminals 135 and 136 and arrangement input terminals 145 and 146, respectively, the latter through current limiting resistor 147. A different potential may then be applied to each of the two arrangement input terminals so as to apply a distinct pattern of potentials over the output conductors when one of the boards is inserted in an associated connector. Depending on the choice of potentials, current limiting resistor 147 may be likewise connected to input terminal 145 instead of terminal 146.

With the arrangement thus connected, a positive source of potential may be applied to arrangement input terminal 146, input terminal 145 being connected to ground, to generate the various patterns of potentials on output conductors 171 through 174. When just one board is inserted in an associated connector, a distinct pattern of potentials consisting of high and low logic levels will appear on the output conductors to identify the type or, more particularly, the identification code of the board. By way of example, when only circuit board 111 is inserted in connector 121, a high logic level will appear on each of output conductors 171 and 172, while a low logic level will appear on each of output conductors 173 and 174. The combination of high and low logic levels forms a unique identification code to identify that type of board. When additional boards with the same identification code are inserted such as, for example, circuit boards 112 and 113, the same distinct pattern of high and low logic levels will appear on the output conductors.

However, when different types of boards, i.e., circuit board 114 and any one of like boards 111 through 113, are inserted, a first predetermined pattern of potentials other than a distinct pattern will appear on the output conductors. This occurs when the same identification conductor on at least two baords is connected to a different board input terminal. For example, identification conductor 152 on board 111 interconnects identification and input terminals 102 and 106, whereas, the same identification conductor on board 114 connects identification terminal 102 to input terminal 105. Thus, with the same identification conductor on at least two boards connected to a different input terminal, the identification conductors interconnect all the output conductors thereby causing all the output conductors to assume one of the two potentials. In this illustrative embodiment, all the output conductors will assume a low logic level which forms the first predetermined pattern of potentials. This pattern will appear when any two different types of boards are inserted, regardless of the individual types.

In addition, the arrangement includes circuitry effective when all of the boards are absent from the connectors for applying to the output conductors a second predetermined pattern of potentials which is different from all the other patterns. This circuitry includes a plurality of resistors 141 through 144, which is connected to output conductors 171 through 174, respectively, for applying a potential other than the potential applied in the first predetermined pattern to each of the output conductors. In this embodiment, all of the resistors are connected to arrangement input terminal 148 to which the positive source of potential may be applied. When all of the boards are absent from the connectors, a high logic level will appear on each output conductor to form the second predetermined pattern of potentials representative of the absence of all boards.

To amplify the output signals, a plurality of amplifiers 181 through 184 are connected to output conductors 171 through 174, respectively. The amplified output signals may then drive other logic circuitry which may be connected to amplifier output terminals 185 through 188.

Also included in the illustrative arrangement is a plurality of conducting paths each associated with one of the connectors. Each path includes one of conductors 191 through 194 and is completed when a board is inserted in an associated connector, thereby connecting board output terminal 107 to a correspondingly positioned terminal 137 in the connector array. In addition, a corresponding plurality of amplifiers 195 through 198 is connected to conductors 191 through 194, respectively. These amplifiers may also drive the logic circuitry which may be connected to amplifier output terminals 185 through 188. Another corresponding plurality of resistors 210 through 204 is connected to conductors 191 through 194, respectively, to apply a high logic level to each conducting path when all the boards are absent from the connectors. This high logic level is developed by applying a source of potential to input terminal 205 connected to the common end of resistors 201 through 204. As each board is inserted, the corresponding conductor path is completed thereby grounding the associated resistor and causing a low logic level or second potential to be applied to the asociated amplifier. Thus, a low logic level on a conducting path is representative of when a circuit board has been inserted in an associated connector, and a high logic level on the path is representative of when a board is absent from the associated connector. These two levels or potentials are then amplified by amplifiers 195 through 198 and subsequently appear on amplifier output terminals 185 through 188, respectively.

To reduce the number of amplifier output terminals required, amplifiers 181 through 184 and 195 through 198 share output terminals 185 through 188 in response to a control signal from an external controller which may be connected to control terminal 189. To accomplish this, each amplifier may be any well-known and commerically available tri-state amplifier. In one state, the amplifier assumes a high impedance level; whereas, the other two states amplify high and low logic levels. When one of the two interconnected amplifiers assumes the high impedance level, the output signal of the other is essentially unaffected. The control signal at one level causes amplifiers 181 through 184 to assume the high impedance state while amplifiers 195 through 198 assume one of the other two states. Similarly, when the control signal is at a second level, amplifiers 195 through 198 assume the high impedance state. To facilitate this scheme, amplifiers 181 through 184 are directly connected to control terminal 189, whereas, amplifiers 195 through 198 are connected through inverter 190 to the control terminal.

What has been described is only one specific illustrative embodiment of this invention, involving circuit boards and connectors. It is to be understood that various and numerous other arrangements for identifying when different types of electrical components are concurrently joined with associated connector assemblies may be devised by one skilled in the art without departing from the spirit and scope of the invention as limited only by the accompanying claims. It is also to be understood that the associated connector assemblies may include any electrical component which connects to or joins with any other component. By way of example, this may include a substrate or circuit board for mounting an integrated circuit thereon.

What is claimed is:

1. In a plurality of electrical components and connector assemblies, an arrangement for indicating when different types of said electrical components are concurrently joined with said connector assemblies; said arrangement comprising:
    a plurality of output conductors common to said connector assemblies, and
    a plurality of identification conductors on each of said components, each plurality of identification conductors adapted for applying a distinct pattern of potentials on said output conductors when one of said components is joined with one of said connector assemblies to identify the type of the joined component and, when different types of said components are concurrently joined with said connector assemblies, all of said output conductors and the identification conductors on the joined ones of said components being interconnected for applying to said output conductors a first predetermined pattern of potentials other than said distinct patterns.

2. An arrangement in accordance with claim 1 in which said arrangement further comprises means for applying to said output conductors said distinct pattern of potentials when like types of said components are concurrently joined with said connector assemblies.

3. An identification arrangement in accordance with claim 2 in which said arrangement further comprises means effective when all of said components are absent from said connector assemblies for applying to said output conductors a second predetermined pattern of potentials other than said first predetermined and said distinct patterns.

4. An arrangement in accordance with claim 3 in which said arrangement further comprises a first plurality of amplifier means corresponding to and connected respectively to said plurality of output conductors for amplifying any one of said patterns of potentials.

5. An arrangement in accordance with claim 4 in which said arrangement further comprises a plurality of conducting paths each associated with one of said connector assemblies and each being completed when a component is joined with the associated connector assembly.

6. An arrangement in accordance with claim 5 in which said arrangement further comprises a second plurality of amplifier means corresponding to and connected respectively to said plurality of conducting paths each for amplifying a first and a second output potential, said first output potential representative of when a conducting path is completed, said second output potential representative of when the conducting path is incomplete.

7. An arrangement in accordance with claim 6 in which each amplifier means in said first and said second plurality has three output states, said first and second pluralities of amplifier means being alternatively responsive to a control signal to assume one of said three output states.

8. In a system having a plurality of electrical components and associated connector assemblies, each connector assembly having a plurality of output terminals, each component having a plurality of identification terminals positioned thereon to connect respectively to a corresponding plurality of the output terminals positioned correspondingly on an associated connector assembly when the component and associated connector assembly are joined in a predetermined manner, an arrangement for applying a first predetermined pattern of potentials when different types of components are concurrently joined with associated connector assemblies; said arrangement comprising:
    a plurality of output conductors each for interconnecting the respective terminals of each plurality of output terminals;
    first identification conductor means for connecting at least one terminal in each plurality of identification terminals to a first potential; and
    second identification conductor means for connecting the remaining terminals in each plurality of identification terminals to a second potential, said first and second identification means being connected to different respectively positioned identification terminals on different types of said components and, when different types of said components are concurrently joined with said connector assemblies in said predetermined manner, of all said output conductors and the first and the second identification conductor means on the joined ones of said components being interconnected for applying to said output conductors said first predetermined pattern of said first and second potentials.

9. An identification arrangement in accordance with claim 8 for generating a distinct pattern of potentials indicative of the types of like type of components when like types of components are concurrently joined with associated connector assemblies, said first and second conductor means being connected to the same respectively positioned identification terminals on like types of components.

10. An arrangement in accordance with claim 9 in which said arrangement further comprises circuit means for applying a second predetermined pattern of potentials to said output conductors when said components are absent from all of said connector assemblies.

11. An arrangement in accordance with claim 10 in which said arrangement further comprises a plurality of amplifier means corresponding to and connected respectively to said plurality of conductors for amplifying all of said output signals.

* * * * *

UNITED STATES PATENT AND TRADEMARK OFFICE
CERTIFICATE OF CORRECTION

PATENT NO.   : 4,468,612
DATED        : August 28, 1984
INVENTOR(S)  : Thomas J. J. Starr It is certified that error appears in the above-identified patent and that said Letters Patent is hereby corrected as shown below:

Column 4, line 4, "baords" should read --boards--.

line 54, "210" should read --201--.

Column 6, line 65, (claim 9), "types of like type" should read --type of like types--.

Signed and Sealed this

Twelfth Day of February 1985

[SEAL]

Attest:

DONALD J. QUIGG

Attesting Officer      Acting Commissioner of Patents and Trademarks